(12) United States Patent
Lin et al.

(10) Patent No.: US 9,984,974 B1
(45) Date of Patent: May 29, 2018

(54) METHOD FOR FABRICATING SEMICONDUCTOR DEVICE HAVING A PATTERNED METAL LAYER EMBEDDED IN AN INTERLAYER DIELECTRIC LAYER

(71) Applicant: UNITED MICROELECTRONICS CORP., Hsin-Chu (TW)

(72) Inventors: Ching-Ling Lin, Kaohsiung (TW); Chih-Sen Huang, Tainan (TW); Ching-Wen Hung, Tainan (TW); Jia-Rong Wu, Kaohsiung (TW); Tsung-Hung Chang, Yunlin County (TW); Yi-Hui Lee, Taipei (TW); Yi-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days. days.

(21) Appl. No.: 15/863,986

(22) Filed: Jan. 8, 2018

Related U.S. Application Data

(60) Division of application No. 15/257,921, filed on Sep. 7, 2016, now Pat. No. 9,899,322, which is a continuation of application No. 14/494,607, filed on Sep. 24, 2014, now Pat. No. 9,466,521.

(30) Foreign Application Priority Data

Aug. 28, 2014 (CN) .......................... 2014 1 0430805

(51) Int. Cl.
  *H01L 21/338* (2006.01)
  *H01L 23/528* (2006.01)
  *H01L 21/8234* (2006.01)
  *H01L 27/06* (2006.01)
  *H01L 23/532* (2006.01)
  *H01L 21/768* (2006.01)

(52) U.S. Cl.
  CPC .... *H01L 23/5283* (2013.01); *H01L 21/76816* (2013.01); *H01L 21/76832* (2013.01); *H01L 21/76897* (2013.01); *H01L 21/823475* (2013.01); *H01L 23/53261* (2013.01); *H01L 23/53266* (2013.01); *H01L 27/0629* (2013.01); *H01L 21/76829* (2013.01)

(58) Field of Classification Search
  CPC ........................................................ H01L 51/00
  USPC ......................................... 438/171, 190, 510
  See application file for complete search history.

(56) References Cited

U.S. PATENT DOCUMENTS

| 6,069,398 A | 5/2000 | Kadosh et al. |
| 6,884,715 B1* | 4/2005 | Kwon ............... H01L 21/76897 438/638 |
| 8,361,848 B2* | 1/2013 | Lee ..................... H01L 27/0629 438/171 |
| 8,373,239 B2* | 2/2013 | Siddiqui ........... H01L 21/28088 257/382 |

(Continued)

*Primary Examiner* — Caleb Henry
(74) *Attorney, Agent, or Firm* — Winston Hsu

(57) ABSTRACT

A method for fabricating semiconductor device first includes providing a substrate and a shallow trench isolation (STI) in the substrate, in which the substrate includes a first metal gate and a second metal gate thereon, a first hard mask on the first metal gate and a second hard mask on the second metal gate, and a first interlayer dielectric (ILD) layer around the first metal gate and the second metal gate. Next, the first hard mask and the second hard mask as mask are utilized to remove part of the first ILD layer for forming a recess, and a patterned metal layer is formed in the recess and on the STI.

6 Claims, 4 Drawing Sheets

(56) References Cited

U.S. PATENT DOCUMENTS

| | | | |
|---|---|---|---|
| 8,901,537 B2* | 12/2014 | Murthy | H01L 21/28512 257/19 |
| 2003/0116819 A1* | 6/2003 | Hokazono | H01L 21/76224 257/510 |
| 2006/0022276 A1 | 2/2006 | Park et al. | |
| 2010/0078727 A1 | 4/2010 | Min et al. | |
| 2013/0049168 A1* | 2/2013 | Yang | H01L 27/0629 257/538 |
| 2013/0119480 A1 | 5/2013 | Wong et al. | |
| 2013/0154016 A1* | 6/2013 | Glass | H01L 29/78 257/368 |
| 2013/0248999 A1* | 9/2013 | Glass | H01L 29/36 257/335 |
| 2013/0328131 A1 | 12/2013 | Lu et al. | |
| 2014/0361381 A1* | 12/2014 | Hung | H01L 29/458 257/384 |
| 2015/0060970 A1* | 3/2015 | Sasaki | H01L 27/10855 257/296 |
| 2015/0102461 A1* | 4/2015 | Lee | H01L 27/10814 257/532 |
| 2015/0108589 A1* | 4/2015 | Cheng | H01L 29/511 257/411 |
| 2015/0118836 A1* | 4/2015 | Lin | H01L 29/66545 438/586 |
| 2015/0206942 A1* | 7/2015 | Glass | H01L 29/66795 257/335 |
| 2015/0214367 A1* | 7/2015 | Chang | H01L 21/76897 257/401 |
| 2015/0243663 A1* | 8/2015 | Hung | H01L 21/823821 257/365 |
| 2015/0340326 A1* | 11/2015 | Lytle | H01L 21/823842 257/372 |
| 2015/0348850 A1* | 12/2015 | Lee | H01L 21/823842 438/587 |

* cited by examiner

METHOD FOR FABRICATING SEMICONDUCTOR DEVICE HAVING A PATTERNED METAL LAYER EMBEDDED IN AN INTERLAYER DIELECTRIC LAYER

CROSS REFERENCE TO RELATED APPLICATIONS

This application is a division of U.S. application Ser. No. 15/257,921 filed Sep. 7, 2016, which is a continuation application of U.S. patent application Ser. No. 14/494,607 filed Sep. 24, 2014 (U.S. Pat. No. 9,466,521). The above-mentioned applications are included in their entirety herein by reference.

BACKGROUND OF THE INVENTION

1. Field of the Invention

The invention relates to a semiconductor device, and more particularly to a semiconductor device having high-resistance metal layer embedded within an interlayer dielectric (ILD) layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, integration of metal gate and thin film resistor still faces some issues in conventional FinFET fabrication, such as direct penetration of contact plugs through thin film resistor due to poor location of thin film resistor thereby affecting the performance of the resistor. Hence, how to improve the current FinFET fabrication and structure has become an important task in this field.

SUMMARY OF THE INVENTION

According to a preferred embodiment of the present invention, a method for fabricating semiconductor device is disclosed. First, a substrate is provided, in which the substrate includes a first metal gate and a second metal gate thereon, a first hard mask on the first metal gate and a second hard mask on the second metal gate, and a first interlayer dielectric (ILD) layer around the first metal gate and the second metal gate. Next, the first hard mask and the second hard mask are used as mask to remove part of the first ILD layer for forming a recess, and a patterned metal layer is formed in the recess, in which the top surface of the patterned metal layer is lower than the top surfaces of the first hard mask and the second hard mask.

According to another aspect of the present invention, a semiconductor device includes: a substrate; a first metal gate on the substrate; a first hard mask on the first metal gate; an interlayer dielectric (ILD) layer on top of and around the first metal gate; and a patterned metal layer embedded in the ILD layer, in which the top surface of the patterned metal layer is lower than the top surface of the first hard mask.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
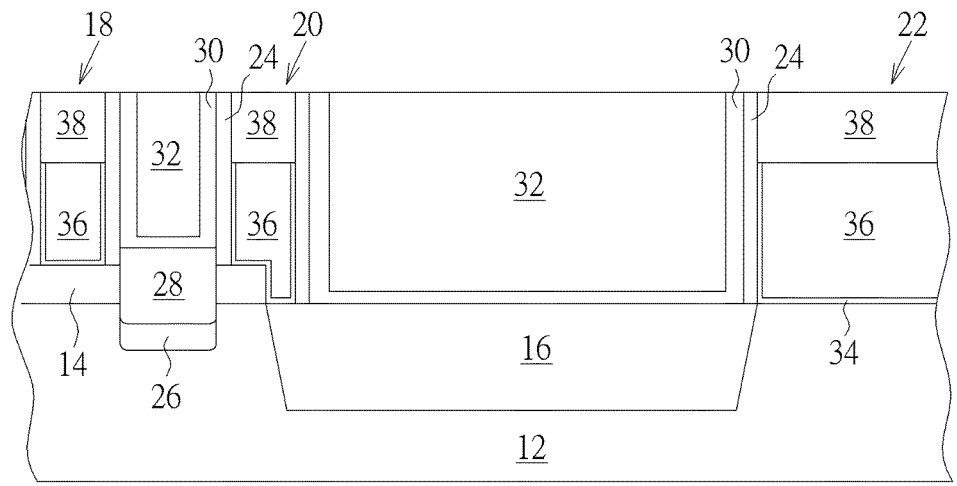
FIGS. 1-6 illustrate a method for fabricating semiconductor device according to a preferred embodiment of the present invention.

Referring to FIGS. 1-6, FIGS. 1-6 illustrate a method for fabricating semiconductor device according to a preferred embodiment of the present invention. Despite this embodiment pertains to a non-planar transistor fabrication process, the embodiment could be applied to both planar and non-planar transistor fabrication process. As shown in FIG. 1, a substrate 12, such as a silicon substrate or silicon-on-insulator (SOI) substrate is provided, and a transistor region, such as a PMOS region or a NMOS region is defined on the substrate 12. At least a first fin-shaped structure 14 and an insulating layer 16 are formed on the substrate 12, in which the bottom of the fin-shapes structure 14 is preferably enclosed by the insulating layer 16, such as silicon oxide to form a shallow trench isolation (STI). A plurality of metal gates 18, 20, 22 are formed on part of the fin-shaped structure 14.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer 16 surrounding the bottom of the fin-shaped structure 14. Alternatively, the formation of the fin-shaped structure 14 could also be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14. In another fashion, the patterned hard mask could be removed selectively or retained, and deposition, CMP, and then etching back could be used to form an insulating layer 16 to surround the bottom of the fin-shaped structure 14. Moreover, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the insulating layer 16 could be eliminated.

The fabrication of the metal gates 18, 20, 22 could be accomplished by a gate first process, a high-k first approach from gate last process, or a high-k last approach from gate last process. Since this embodiment pertains to a high-k first approach, dummy gates (not shown) composed of high-k dielectric layer and polysilicon material could be first formed on the fin-shaped structure 14 and the insulating layer, and a spacer 24 is formed on the sidewall of the dummy gates. A source/drain region 26 and epitaxial layer 28 are then formed in the fin-shaped structure 14 and/or substrate 12 adjacent to two sides of the spacer 24, a contact etch stop layer (CESL) 30 is formed on the dummy gates, and an interlayer dielectric (ILD) layer 32 composed of tetraethyl orthosilicate (TEOS) is formed on the CESL 30.

Next, a replacement metal gate (RMG) process could be conducted to planarize part of the ILD layer 32 and CESL 30 and then transforming the dummy gates into metal gates. The RMG process could be accomplished by first performing a selective dry etching or wet etching process, such as using etchants including ammonium hydroxide ($NH_4OH$) or tetramethylammonium hydroxide (TMAH) to remove the polysilicon layer from dummy gates for forming a recess (not shown) in the ILD layer 32. Next, a conductive layer including at least a U-shaped work function metal layer 34 and a low resistance metal layer 36 is formed in the recess, and a planarizing process is conducted so that the surfaces of the U-shaped work function layer 34 and low resistance metal layer 36 are even with the surface of the ILD layer 32.

In this embodiment, the work function metal layer 34 is formed for tuning the work function of the later formed metal gates to be appropriate in an NMOS or a PMOS. For an NMOS transistor, the work function metal layer 34 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 34 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 34 and the low resistance metal layer 36, in which the material of the barrier layer may include titanium (Ti), titanium nitride (TiN), tantalum (Ta) or tantalum nitride (TaN). Furthermore, the material of the low-resistance metal layer 36 may include copper (Cu), aluminum (Al), titanium aluminum (TiAl), cobalt tungsten phosphide (CoWP) or any combination thereof. Since the process of using RMG process to transform dummy gate into metal gate is well known to those skilled in the art, the details of which are not explained herein for the sake of brevity.

Next, part of the work function metal layer 34 and low resistance metal layer 36 on the ILD layer 32 could be removed to form metal gates 18, 20, 22, part of the metal gates 18, 20, 22 are removed by etching back process, and a hard mask 38 is formed on the metal gates 18, 20, 22 with a planarizing process thereafter. The hard mask 38 could be a single material layer or composite material layer, such as a composite layer containing both silicon oxide and silicon nitride, and the top surface of the hard mask 38 is preferably even with the top surface of the ILD layer 32.

Figure 2:
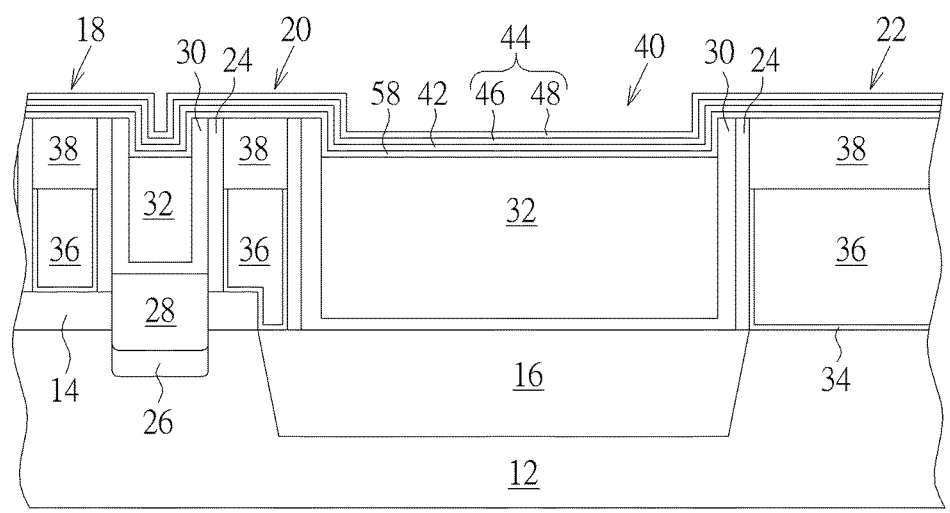

Next, as shown in FIG. 2, by using the difference in etching selectivity between the ILD layer 32 and the hard mask 38, spacer 24, and CESL 30, part of the ILD layer 32 between the metal gates 18, 20, 22 is removed to form a recess 40. An oxide layer 58 could then be deposited selectively on the hard mask 38 and ILD layer 32 to serve as an etching stop layer, and a high resistance metal layer 42 and a dielectric stack 44 are formed on the oxide layer 48.

According to a preferred embodiment of the present invention, the high resistance metal layer 42 includes TiN, the dielectric stack 44 preferably serving as a mask layer could include a silicon nitride layer 46 and a silicon dioxide layer 48, but not limited thereto. Moreover, despite the depth of the recess 40 is lower than the top surface of the hard mask 38 (or original surface of the ILD layer 32) and slightly higher than the bottom of the hard mask 38, the depth of the recess 40 could also be adjusted according to the demand of the product to be lower than the top surface of the hard mask 38 while substantially even with or lower than the bottom surface of the hard mask 38, which is also within the scope of the present invention.

Figure 3:
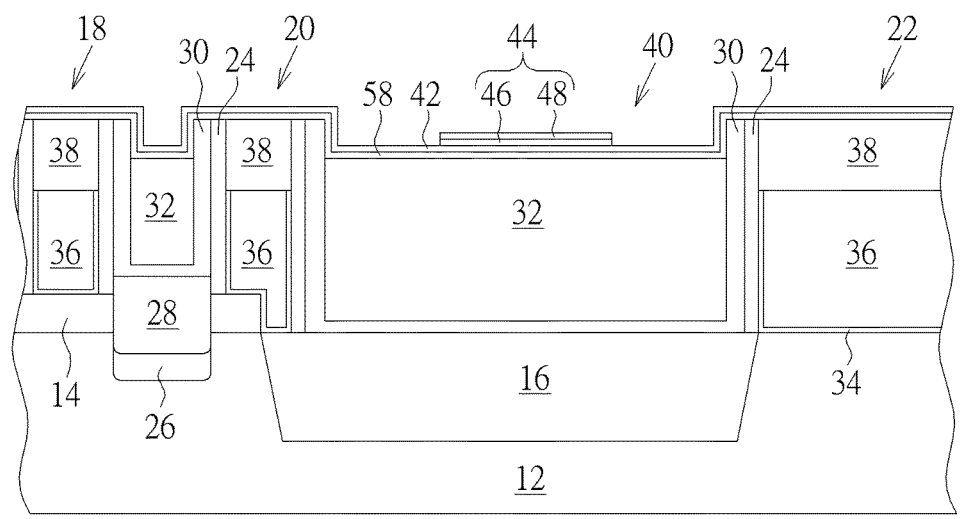
Figure 4:
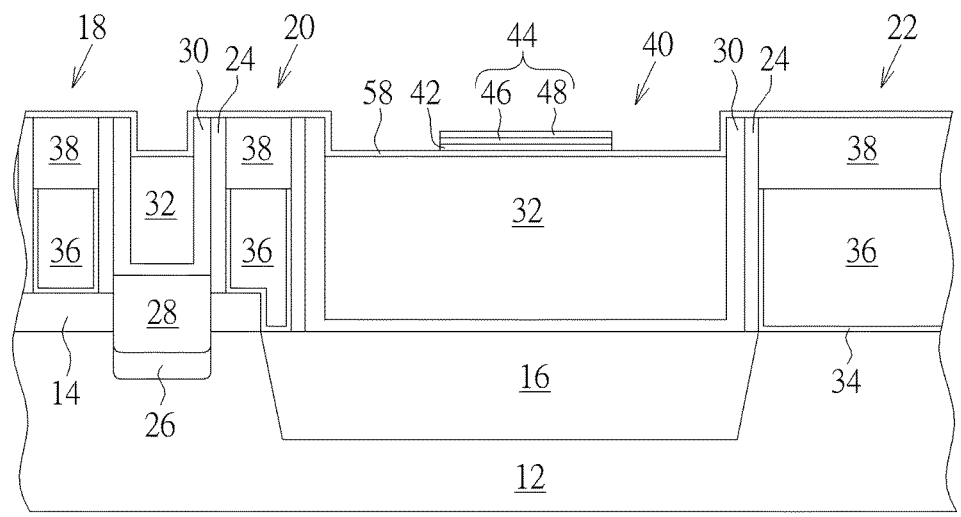

Next, as shown in FIG. 3, the dielectric stack 44 and the high resistance metal layer 42 are patterned to form a patterned dielectric stack 44 and a patterned high resistance metal layer 42 in the recess 40. Preferably, the patterning of the dielectric stack 44 and high resistance metal layer 42 could be accomplished by first forming a patterned resist (not shown) on the dielectric stack 44, and a dry etching is conducted by using the patterned resist as mask to remove part of the dielectric stack 44 for forming patterned dielectric stack 44 on the ILD layer 32 of the recess 40. Next, as shown in FIG. 4, the aforementioned patterned resist could be removed selectively by using the patterned dielectric stack 44 as etching mask, or performs a wet etching process by using the patterned resist as mask again to remove part of the high resistance metal layer 42 for forming patterned high resistance metal layer 42 so that both the patterned dielectric stack 44 and patterned high resistance metal layer 42 are disposed on the ILD layer 32 within the recess 40, in which the top surfaces of the patterned dielectric stack 44 and patterned high resistance metal layer 42 are both lower than the top surface of the hard mask 38.

Figure 5:
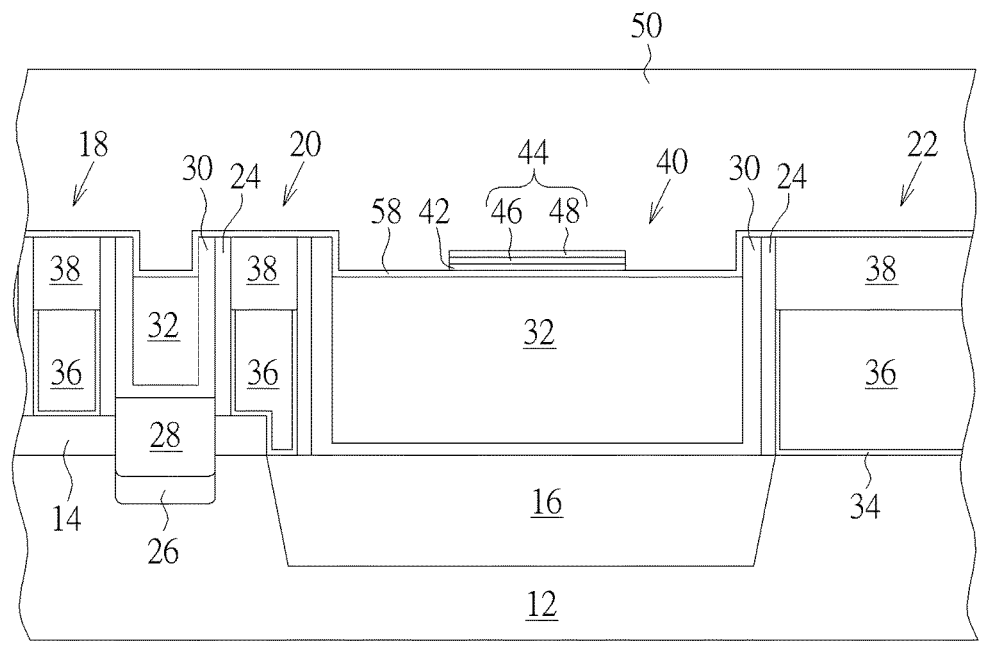

Next, as shown in FIG. 5, another ILD layer 50 is formed on the oxide layer 58, hard mask 38, ILD layer 32, patterned dielectric stack 44, and patterned high resistance metal layer 42. In this embodiment, the ILD layer 50 is preferably composed of same material as the ILD layer 32, such as TEOS.

Figure 6:
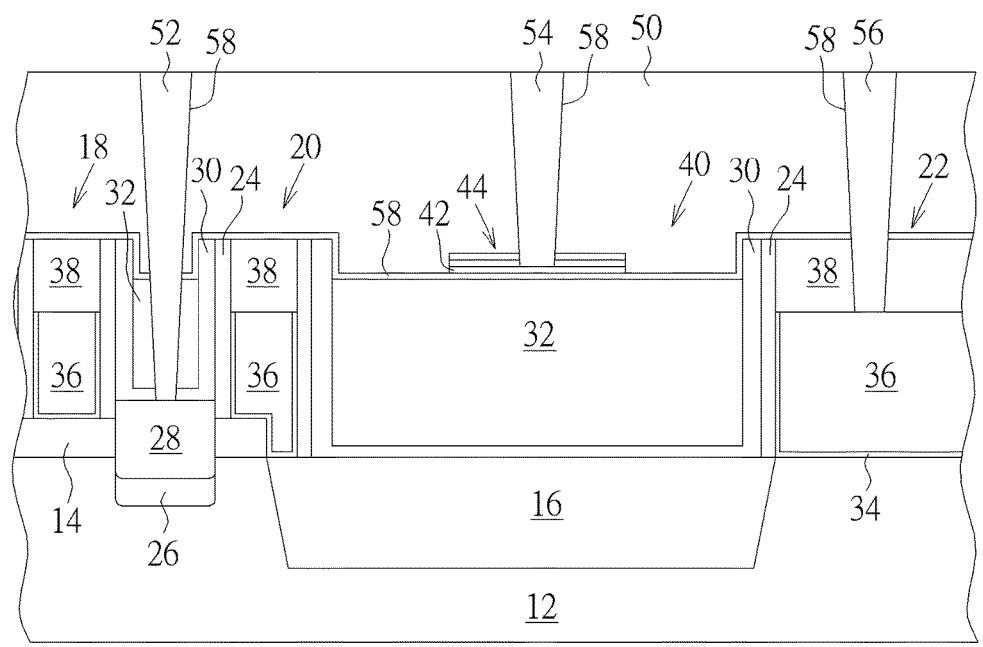

Next, as shown in FIG. 6, a contact plug 52 is formed in the ILD layer 50 and ILD layer 52 to electrically connect the source/drain region 26 and epitaxial layer 28 adjacent to the metal gate 18, and another contact plug 54 is formed in the ILD layer 50 to electrically connect the patterned high resistance metal layer 42 and a contact plug 56 in the ILD layer 50 to electrically connect the metal gate 22. The formation of the contact plugs 52, 54, 56 could be accomplished by first forming a plurality of contact holes (not shown) in the ILD layers 32, selectively forming silicides on the surface of the source/drain region 26 and epitaxial layer 28 exposed by the contact holes, and depositing a barrier/adhesive layer (not shown), a seed layer (not shown), and a conductive layer (not shown) into the contact holes, in which the barrier/adhesive layer is conformally deposited into the contact holes while the conductive layer is filled the contact holes entirely. The barrier/adhesive layer may be consisted of tantalum (Ta), titanium (Ti), titanium nitride (TiN) or tantalum nitride (TaN), tungsten nitride (WN) or a suitable combination of metal layers such as Ti/TiN, but is not limited thereto. A material of the seed layer is preferably the same as a material of the conductive layer, and a material of the conductive layer may include a variety of low-resistance metal materials, such as aluminum (Al), titanium (Ti), tantalum (Ta), tungsten (W), niobium (Nb), molybdenum (Mo), copper (Cu) or the likes, preferably tungsten or copper, and most preferably tungsten. Next, a planarizing process such as CMP process and/or etching process to remove part of the barrier/adhesive layer, seed layer, and conductive layer so that the top surface of the remaining conductive layer is even with the top surface of the ILD layer to form contact plugs 52, 54, 56. This completes the fabrication of a semiconductor device according to a preferred embodiment of the present invention.

It should be noted that the formation of the contact holes (not shown) in the ILD layers 32 and 50 for fabricating contact plugs 52, 54, 56 could be accomplished by an integration of double patterning technique. For instance, the fabrication of the contact plug 52 electrically connected to the source/drain region 26, the contact plug 54 electrically connected to the patterned high resistance metal layer 42, and the contact plug 56 electrically connected to the metal gate 22 could be adjusted depending on parameters such as etching depth, pattern density, and aspect ratio. For instance, if same etching depth were to be considered, the depth of the recess 40 could be adjusted to be even with or slightly lower than the bottom of the hard mask 38 so that the contact holes (not shown) for forming contact plugs 54 and 56 could be formed at the same time in the ILD layer 50 without etching through the high resistance metal layer 42. Alternatively, if the depth of the recess 40 were to be adjusted to be substantially lower than the bottom of the hard mask 38 or substantially even with the epitaxial layer 28, contact holes (not shown) for forming contact plugs 52 and 54 could be formed simultaneously.

Referring again to FIG. 6, a semiconductor device structure is further disclosed, in which the semiconductor device includes a substrate 12, a plurality of metal gates 18, 20, 22 on the substrate 12, a plurality of hard masks 38 on the metal gates 18, 20, 22, an ILD layer including ILD layer 32 and ILD layer 50 on the metal gates 18, 20, 22 and around each metal gate 18, 20, 22, and a patterned high resistance metal layer 42 embedded in the ILD layers 32 and 50. A patterned dielectric stack 44 is disposed on the patterned high resistance metal layer 42, in which the patterned dielectric stack 44 includes silicon nitride and silicon dioxide, and the patterned high resistance metal layer 42 includes TiN, but not limited thereto. In this embodiment, the top surface of the patterned high resistance metal layer 42 is lower than the top surface of each hard mask 38, and the top surface of the patterned dielectric stack 44 thereon is also lower than the top surface of each hard mask 38. Nevertheless, the position of the high resistance metal layer 42 and dielectric stack 44 could also be adjusted along with the depth of the recess 40 as disclosed previously, such that the top surfaces of both layers could be lower than the bottom surface of the hard mask 38, which is also within the scope of the present invention.

The semiconductor device further includes a plurality of contact plugs 52, 54, 56 electrically connected to the metal gates and high resistance metal layer 42 respectively, in which the contact plug 52 embedded in the ILD layers 32 and 50 is electrically connected to the source/drain region 26 adjacent to the metal gate 18, the contact plug 54 embedded in the ILD layers 32 and 50 is electrically connected to the patterned high resistance metal layer 42 and the contact plugs 56 in the ILD layer 50 is electrically connected to the metal gate 22. It should be noted that even though a STI composed of insulating layer 16 is disposed directly under the patterned high resistance metal layer 42, the location of the insulating layer 16 could also be adjusted according to the demand of the product. For instance, no insulating layer 16 could be disposed directly under the patterned high resistance metal layer 42, which is also within the scope of the present invention.

Figure 7:
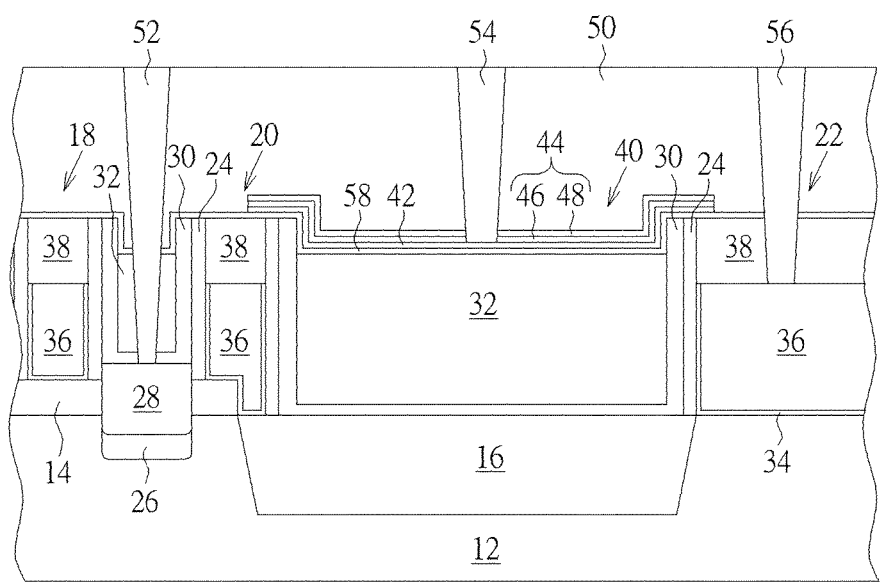
FIG. 7 illustrates a structural view of a semiconductor device according to an embodiment of the present invention.

In addition to the embodiments disclosed in FIGS. 3-4, according to another embodiment of the present invention, as shown in FIG. 7, it would also be desirable to pattern the dielectric stack 44 and high resistance metal layer 42 by first forming a patterned resist (now shown) with substantially greater width on the dielectric stack 44, and then performing a dry etching process by using the patterned resist as mask to remove part of the dielectric stack 44 for forming a patterned dielectric stack 44 on the ILD layer 32 within the recess 40 and on at least one side of the CESL 30, spacer 24, or part of the hard mask 38. Next, the patterned resist could be removed selectively or a wet etching could be conducted by using the patterned resist again as mask to remove part of the high resistance metal layer 42 so that both the patterned dielectric stack 44 and patterned high resistance metal layer 42 are disposed on the ILD layer 32 and two sides of the CESL 30, spacer 24, or part of the hard mask 38. Next, fabrication process from FIGS. 5-6 could be carried out to form another ILD layer 50 on the oxide layer 58, hard mask 38, ILD layer 32, patterned dielectric stack 44, and patterned high resistance metal layer 42, and a plurality of contact plugs 52, 54, 56 are formed to electrically connect the source/drain region 26 and epitaxial layer 28, patterned high resistance metal layer 42, and metal gate 22. From a structural view, the patterned high resistance metal layer 42 is preferably embedded in the ILD layers 32 and 50, in which the patterned high resistance metal layer 42 includes a step profile on the CESL 30, spacer 24, or part of the hard mask 38.

Overall, the present invention preferably forms hard mask on metal gates, uses the hard mask as etching mask to remove part of the ILD layer to forma recess between the metal gates, and then forms a thin film resistor composed high resistance metal layer in the recess. Since part of the ILD layer has already been removed, the top surface of the high resistance metal layer would be substantially lower than the top surface of the adjacent hard mask so that penetration of contact plugs through high resistance metal layer directly thereby affecting the performance of thin film resistor could be prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:

providing a substrate and a shallow trench isolation (STI) in the substrate, wherein the substrate comprises a first metal gate and a second metal gate thereon, a first hard mask on the first metal gate and a second hard mask on the second metal gate, and a first interlayer dielectric (ILD) layer around the first metal gate and the second metal gate;

utilizing the first hard mask and the second hard mask as mask to remove part of the first ILD layer for forming a recess; and forming a patterned metal layer in the recess and on the STI, wherein the top surface of the patterned metal layer is lower than the top surfaces of the first hard mask and the second hard mask and an absolute bottom surface of the patterned metal layer is higher than a top surface of the metal gate.

2. The method of claim 1, further comprising:
forming a metal layer on the first hard mask, the second hard mask, and the first ILD layer;
forming a dielectric stack on the metal layer;
patterning the dielectric stack and the metal layer to form a patterned dielectric stack and the patterned metal layer in the recess;
forming a second ILD layer on the first hard mask, the second hard mask, the first ILD layer, the patterned dielectric stack and the patterned metal layer;
forming a first contact plug in the second ILD layer and the first ILD layer for electrically connecting to a source/drain region adjacent to the first metal gate; and
forming a second contact plug in the second ILD layer for electrically connecting to the patterned metal layer and forming a third contact plug in the second ILD layer for electrically connecting to the second metal gate.

3. The method of claim 2, wherein the step of patterning the dielectric stack and the metal layer comprises:
performing a first etching process to remove part of the dielectric stack for forming the patterned dielectric stack in the recess and on the first ILD layer; and
performing a second etching process to remove part of the metal layer.

4. The method of claim 2, wherein the step of patterning the dielectric stack and the metal layer comprises:
performing a first etching process to remove part of the dielectric stack for forming the patterned dielectric stack on the first ILD layer, the first hard mask, and the second hard mask; and
performing a second etching process to remove part of the metal layer.

5. The method of claim 2, wherein the dielectric stack comprises silicon nitride and silicon dioxide.

6. The method of claim 1, wherein the patterned metal layer comprises TiN.

* * * * *